United States Patent [19]

Kenney

[11] Patent Number: 4,801,988
[45] Date of Patent: Jan. 31, 1989

[54] SEMICONDUCTOR TRENCH CAPACITOR CELL WITH MERGED ISOLATION AND NODE TRENCH CONSTRUCTION

[75] Inventor: Donald M. Kenney, Shelburne, Vt.

[73] Assignee: International Business Machines Corporation, Armonk, N.Y.

[21] Appl. No.: 925,570

[22] Filed: Oct. 31, 1986

[51] Int. Cl.⁴ .......................................... H01L 29/78
[52] U.S. Cl. .................................. 357/23.6; 357/54; 357/47; 357/55; 357/50; 357/59
[58] Field of Search .................... 357/49, 23.6, 47, 50, 357/59 I, 59 L, 54, 55

[56] References Cited

U.S. PATENT DOCUMENTS

| | | | |
|---|---|---|---|
| 4,238,278 | 12/1980 | Antipov | 357/55 X |
| 4,651,184 | 3/1987 | Machi | 357/23.6 |
| 4,661,832 | 4/1987 | Lechaton et al. | 357/49 |
| 4,688,063 | 8/1987 | Lu et al. | 357/23.6 |
| 4,688,069 | 8/1987 | Joy et al. | 357/49 X |

FOREIGN PATENT DOCUMENTS 0201706 11/1986 European Pat. Off. .......... 357/23.6

OTHER PUBLICATIONS

"Dynamic Ram Cell with Merged Drain and Storage", IBM Technical Disclosure Bulletin, vol. 27, Apr. 1985.
"CMOS Dynamic Random Access Memory Cell", IBM Technical Disclosure Bulletin, vol. 28, Nov. 1985.

Primary Examiner—Andrew J. James
Assistant Examiner—William A. Mintel
Attorney, Agent, or Firm—Sughrue, Mion, Zinn, Macpeak & Seas

[57] ABSTRACT

A semiconductor trench capacitor construction having a self-aligned isolation structure formed within the trench. The trench isolation structure consists of a thick isolating layer formed along the upper portion of the trench side walls. The trench isolation structure facilitates larger capacitor constructions and allows the capacitors to abut adjacent capacitors and other devices.

9 Claims, 4 Drawing Sheets

SEMICONDUCTOR TRENCH CAPACITOR CELL WITH MERGED ISOLATION AND NODE TRENCH CONSTRUCTION

BACKGROUND OF THE INVENTION

Cross-Reference to Related Applications

Reference is made to commonly-assigned U.S. patent application entitled "Dynamic RAM Cell Having Shared Trench Storage Capacitor With Sidewall-Defined Bridge Contacts and Gate Electrodes", Ser. No. 919,940 filed Oct. 17, 1986 by the present inventor and assigned to the assignee of the present invention. This referenced application relates to a trench memory cell in which the polysilicon that fills the trench extends above the surface of the silicon substrate, in order to provide a mandrel upon which both the bridge contacts that couple the polysilicon to an adjacent source diffusion and the gate electrodes of the associated FETS can be defined.

Reference is also made to commonly-assigned U.S. patent application Ser. No. 626,512, entitled "Dynamic RAM Cell with MOS Trench Capacitor in CMOS," filed June 29, 1984 by Lu et al. This application relates to a trench cell in which a polysilicon-filled trench extends through a well region formed on an epitaxial region, into the underlying substrate. The resulting poly-to-substrate storage capacitance is considerably enhanced.

Reference is further made to commonly-assigned U.S. patent application Ser. No. 793,401, entitled "High Density Memory," filed Oct. 31, 1985 by the present inventor now U.S. Pat. No. 4,751,558 issued June 14, 1988. This application relates to a DRAM trench cell in which a polycrystalline silicon (polysilicon) capacitor electrode is disposed on the bottom of the trench and the gate electrode of the transfer gate field effect transistor (FET) is disposed on the side wall of the trench so as to define a vertical channel region between the diffused capacitor electrode and the diffused bitline formed on a portion of silicon defined by adjacent trenches.

Finally, reference is made to commonly-assigned U.S. patent application Ser. No. 885,618, entitled "Two Square Memory Cells," filed July 15, 1986 by Garnache et al now U.S. Pat. No. 4,769,786 issued Sept. 6, 1988. This application relates to a DRAM trench cell in which the bottom portion of the trench is filled with polysilicon to define separate storage capacitors on each side of the trench, and the upper portion of the trench has gate electrodes so that a conductive channel is formed along the side walls of the trench.

FIELD OF THE INVENTION

The present invention relates to a semiconductor trench capacitor cell with merged isolation and node trench construction.

BACKGROUND ART

Parallel with the recent exponential growth in the use of integrated circuits, has come the development of numerous types of semiconductor memory devices. The memory device type of the present invention is a dynamic memory cell wherein a bit is represented by a charge stored in a capacitor structure. More specifically, the present invention relates to a semiconductor trench capacitor cells whose construction facilitates greater capacitor cell area, greater storage capacity, and the ability to construct more densely packed memory arrays.

Many different types of semiconductor trench and storage capacitor constructions have been proposed. Prior art of which Applicant is aware, includes: U.S. Pat. No. 4,238,278 issued to Antipov; IBM Technical Disclosure Bulletin, Vol. 27, No. 11, April 1985 concerning a "Dynamic RAM cell with merged drain and storage"; and IBM Technical Disclosure Bulletin, Vol. 28, No. 6, November 1985 concerning a "CMOS dynamic random access memory cell". These prior art approaches will now be described in greater detail.

In U.S. Pat. No. 4,238,278 issued to Antipov, there is described a method for making both shallow and deep recessed oxide isolation trenches in semiconductor substrates. Antipov results in both shallow and deep recessed isolation trenches in which a thick oxide isolation layer is used along the entire wall surface of the trench.

IBM Technical Disclosure Bulletin, Vol. 27, No. 11, and IBM Technical Disclosure Bulletin, Vol. 28, No. 6 disclose trench capacitor cells, whereby a recessed oxide (ROX) isolation layer is constructed between adjacent trench capacitor cells. This type of approach will be illustrated and described with reference to FIG. 1, wherein a composite semiconductor substrate 10 is shown to have an N- well portion 30 formed in a P+ substrate 20. On the surface of the composite semiconductor substrate 10, there is constructed a transistor consisting of a P+ source diffusion 50, a gate electrode 60, and a P+ drain diffusion 70, the gate electrode 60 being separated from substrate 10 by a thin insulation layer 15. To the left of the source 50, there is shown a partial section of a recessed oxide isolation layer 99 which can be used to support and insulate additional memory array circuitry (e.g. wordlines and bitlines, not shown). Below the drain 70 there is disclosed a prior art semiconductor trench capacitor cell 40. The semiconductor trench capacitor cell 40 is constructed of a trench having a thin insulation layer 90 disposed upon its walls, the remainder of the trench being filled with a layer of doped polysilicon 80. The polysilicon material 80 is a conductive material such that it serves as a conductive electrode which is insulated from the semiconductor substrate 10 by the thin insulation layer 90. The trench capacitor cell 40 is able to store charge in the polysilicon material 80, and thus to function as a capacitor.

To the right of the semiconductor trench capacitor cell 40 in FIG. 1, there is also constructed an adjacent semiconductor trench capacitor cell 110. The adjacent semiconductor trench cell capacitor also has a thin insulation layer 130, and is filled with a polysilicon material 120. These semiconductor trench capacitor cells 40 and 110 are necessarily placed apart and are isolated from one another by the Recessed Oxide (ROX) isolation layer 100. The need for separation and isolation of the adjacent semiconductor trench capacitor cells 40 and 110 is due to the trench to adjacent device electrical limitations. If the semiconductor trench capacitor cells 40 and 110 are not provided with the necessary isolation, there would be numerous incidences of interference due to the electrical interaction between adjacent semiconductor trench capacitor cells, i.e., there would be parasitic device formation between each trench capacitor and an active semiconductor region abutting the trench capacitor.

Although the above described approach allows the construction of trench capacitor cells which avoid interference and breakdown problems, this construction has been found to be impracticable in the construction of densely packed memory arrays. As the number of dynamic memory cells to be fabricated on a semiconductor substrate increases above one million, there will be a limitation on the amount of substrate surface area which can be devoted to each individual memory cell.

As shown in FIG. 1, surface isolation regions such as ROX regions 99 and 100 consume an appreciable percentage of the total chip surface area. It would be beneficial to reduce the amount of chip surface area consumed by these isolation regions, while at the same time preserving the integrity of the charge stored in adjacent memory cells.

Consequently, there exists a need for an improved approach in the construction of semiconductor trench capacitor cells to facilitate construction of densely packed arrays. More specifically, there exists a need for improvements which allow both the construction of trench capacitor cells having greater cell area, making a more efficient use of the semiconductor substrate area.

SUMMARY OF THE INVENTION

The present invention provides a unique approach to satisfy the aforementioned needs. More specifically, the present invention uses an approach of merging the isolation layer and node trench such that the isolation regions are self aligned to the trench side walls. Thus, trench capacitors of greater area can be constructed in a given space. Moreover, these larger trench capacitors can be placed more closely to adjacent trench capacitor cells. As a result, the overall area of the semiconductor substrate 10 is more efficiently utilized, and trench capacitor cells of sufficient charge storage capacity to facilitate the construction of densely packed memory arrays are realized.

Accordingly, the present invention relates to a semiconductor trench capacitor structure, comprising: a semiconductor substrate; a trench formed in said semiconductor substrate, said trench having a bottom wall, and a side wall which has an upper side wall portion and a lower side wall portion; a thin insulating layer formed on said bottom wall and said lower side wall portion; a thick isolating layer formed on a portion of said upper side wall portion to provide isolation; and a conductive electrode formed of a conductive material filling the remainder of said trench.

The present invention also relates to a method of producing a semiconductor trench capacitor structure having an isolation region formed within its trench, said method comprising: forming a trench in a semiconductor substrate, said trench defined by a bottom wall and a side wall having an upper side wall portion and a lower side wall portion, forming a thin insulating layer on said bottom wall and said lower side wall portion; forming a thick insulating layer on at least a portion of said upper side wall portion; and, filling the remainder of said trench with a conductive material.

It is therefore an important object of this invention to provide a semiconductor trench capacitor having increased size, and therefore increased charge storage capacity.

It is a second object of this invention to provide a method of constructing a semiconductor trench capacitor which has an isolation structure within the filled trench.

It is another object of this invention to provide a semiconductor trench capacitor structure which facilities the construction of densely packed arrays.

It is still a further object of the present invention to provide a semiconductor trench capacitor structure which can be closely placed to adjacent semiconductor trench capacitor structures.

These and other objects and advantages of the present invention will become more fully apparent from the following description made in connection with the accompanying drawings, wherein:

DESCRIPTION OF THE PREFERRED EMBODIMENT

Figure 2:
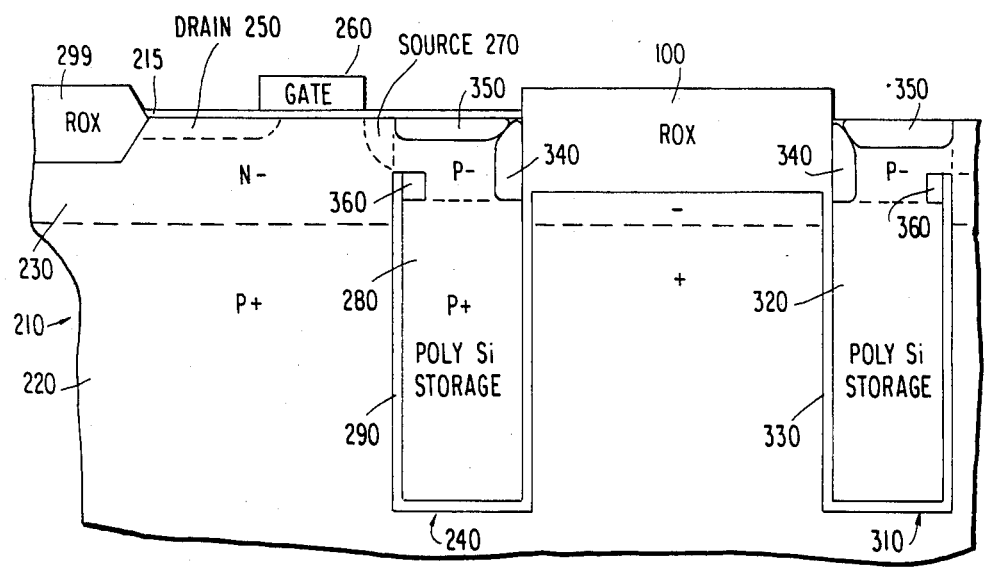
FIG. 2 is a diagram showing the construction of a dynamic memory cell with a semiconductor trench capacitor cell of the present invention.

Turning now to FIG. 2, a dynamic memory cell with a semiconductor trench capacitor cell structure of the present invention is shown. The dynamic memory cell is formed in a composite semiconductor substrate 210 in which for a N- well 230 is formed in a P+ substrate portion 220. On the surface of the semiconductor substrate 210, a transistor is constructed of a P+ drain diffusion 250, a gate electrode 260, and a P+ source diffusion 270. The insulation between the gate electrode 260 and the substrate as well as the thin insulating layer on top of the source diffusion 250 and drain diffusion 220 is shown schematically as a single thin insulation layer 215. To the left of the source 250, there is shown a partial section of a Recessed Oxide layer 299 which can be used to support and insulate additional memory array circuitry (e.g. wordlines and bitlines, not shown). Adjacent to the drain diffusion 270 is a semiconductor trench capacitor cell 240 of the present invention. The semiconductor trench capacitor cell 240 is insulated from the semiconductor substrate 210 by a thin insulation layer 290, and is isolated from adjacent semiconductor trench capacitor cells by side-wall defined, thick isolation layers 340 and 350. Also shown for illustration is another semiconductor trench capacitor cell 310. The semiconductor trench capacitor cell 310 is also insulated from the semiconductor substrate 210 by a thin insulation layer 330, and is isolated from adjacent devices by thick isolation layers 380 and 390. Both semiconductor trench capacitor cells are filled with a P+ doped conductive polysilicon 280 and 320 respectively.

Figure 1:
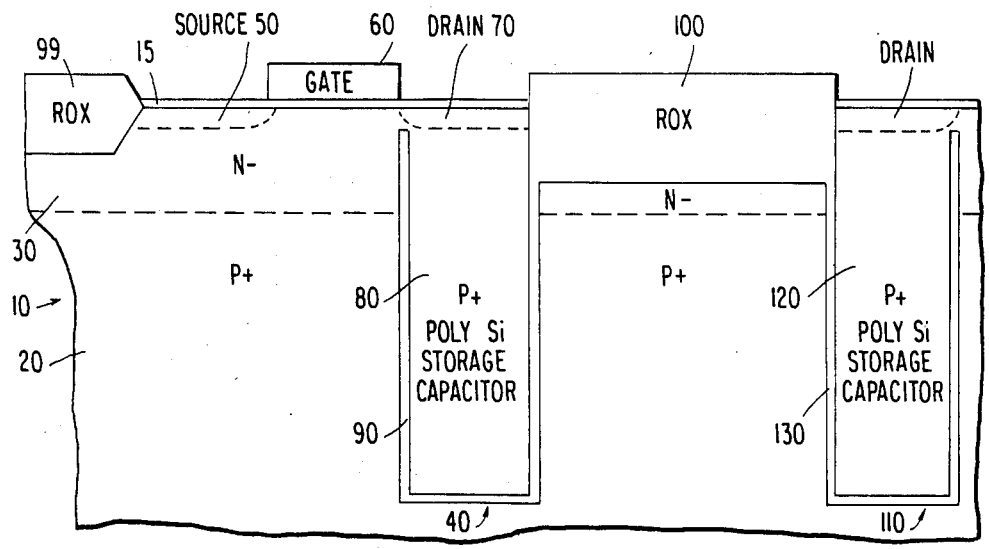
FIG. 1 is a diagram showing the construction of a dynamic memory cell with a prior art semiconductor trench capacitor cell.

As can be seen by a comparison of the present invention in FIG. 2 with the prior art device in FIG. 1, the Recessed Oxide isolation layer 100 between adjacent semiconductor trench capacitor cells 40 and 110 in FIG. 1, has been supplemented by an alternative structure. Instead of relying solely upon a Recessed Oxide isolation layer disposed on the surface of the substrate to isolate adjacent semiconductor trench capacitor cells, the isolation structure of the present invention is formed within the trench. By forming an isolation structure that is self-aligned to the trench side walls, extra chip space that was devoted to isolating the trench from the channel of the adjacent transistor device is no longer needed. In effect, since the isolation is defined by the trench side wall itself, the trench can now abut the adjacent channel. This greatly increases the size of the trench capacitor, enhancing its charge storage capacity.

A comparison of FIGS. 1 and 2 does not immediately reflect the advantages of the invention. That is, as shown in the particular cross-section of FIG. 2, (i.e. from top-to-bottom of the overhead view of the invention as shown in FIG. 5), the cell area of the invention appears to be equivalent to that realized by the prior art cell as shown in FIG. 1. However, as will be described in relation to FIGS. 4 and 5, the capacitor-to-adjacent transistor device spacing is greatly decreased by utilization of the present invention.

Figure 3A:
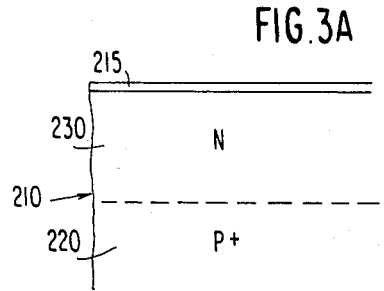
FIGS. 3A through 3H show the steps used in the fabrication of a semiconductor trench capacitor cell of the present invention.

Turning now to FIG. 3A, an illustration is shown of the beginning step in constructing a semiconductor trench capacitor cell of the present invention. A semiconductor substrate 210 is shown with an N- well 230 formed in the P+ substrate 220. A thin insulation layer 215 is then formed along the surface of the semiconductor substrate 210 via known semiconductor methods, for example, via oxidation growth or chemical-vapor-deposition.

Figure 3B:
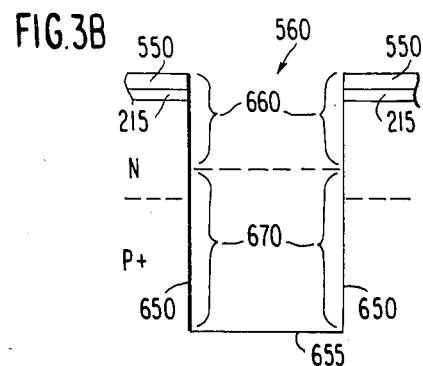

Turning now to FIG. 3B, the next step of construction is shown. A masking oxide layer 550 has been formed on top of the thin insulation layer 215, and has been patterned to allow a trench 560 to be formed down into the semiconductor substrate 210. The trench 560 can be formed via known semiconductor methods, for example, reactive-ion-etching (RIE) in a chlorine gas. The trench 560 is defined by a bottom wall 655, and a side wall 650 having an upper side wall portion 660 and a lower side wall portion 670. These side walls are defined by an etch to be described below. In a preferred embodiment, the upper side wall portion 660 occupies approximately the top 10% to 20% of the side walls 650, and the lower side wall portions 670 occupies approximately the lower 80% to 90% of the side walls 650. However, it should be noted that these percentages are only exemplary of the preferred embodiment, the present invention also being useful with other upper and lower side wall arrangements.

It should also be noted that the vertical cross sections of the trench constructions in the present application have been illustrated as rectangular to simplify the description. The scope of the present invention is by no means meant to be limited to trench constructions of this geometric shape. In fact, in using practical semiconductor methods, the formation of a perfectly rectangular trench is probably impracticable; the trench is much more likely to have a vertical side wall which merges to form a round cupped bottom rather than a perpendicular flat bottom. In this type of arrangement, the vertical wall portions would correspond to this side wall, and the upper portion would correspond to the bottom wall.

Figure 3C:
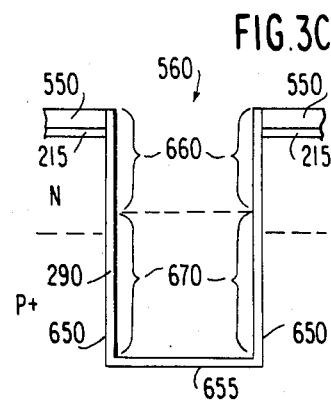

In the next step of construction shown in Figure 3C, a thin insulating layer 290 is formed along the trench side walls 650. This thin insulating layer 290 may be formed by known semiconductor methods, for example, oxidation growth or chemical-vapor-depositing. This insulating layer may be comprised of silicon oxide, silicon nitride, or a composite of both materials. Next in FIG. 3D the trench 560 is filled with a polysilicon fill 580. The polysilicon fill 580 is doped with boron to form a P+ conductive material which will facilitate the storage of charge in the final semiconductor trench capacitor structure. Note that the polysilicon fill 580 is insulated from the semiconductor substrate 210 by the thin insulating layer 290.

Figure 3D:
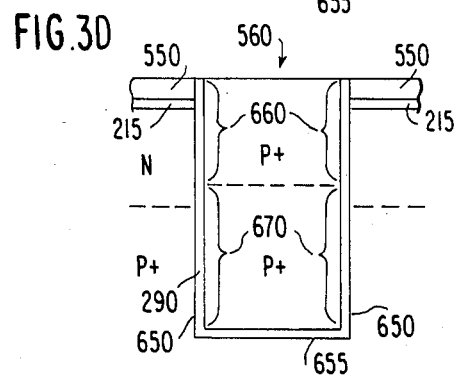
Figure 3E:
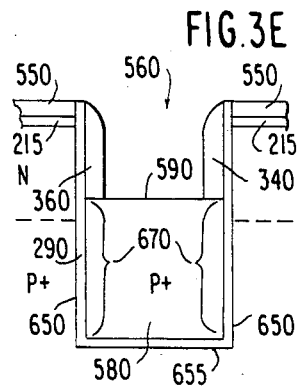

After the trench 560 has been filled with the polysilicon fill 580, a portion of the polysilicon 580 is removed from the trench 560, exposing upper portion of the trench side walls. The point at which the removal is terminated will define the top of the trench lower side wall portions 670. This is shown in FIG. 3E, and in the preferred embodiment the polysilicon fill 580 would be left in the lower 80% of the trench 560. After the polysilicon fill 580 has been removed to this level, thick isolating layers 340 and 360 are formed along the trench upper side wall portions 660. these thick isolating layers 340 and 360 are formed by chemical-vapor-deposition of a conformal isotropic isolating layer, such as silicon oxide, followed by an isotropic etch (e.g. RIE) that removes the horizontal portions of the oxide without removing the vertical portions coated on the side walls of the trench. In a preferred embodiment, the thick isolating layers 340 and 360 would be formed along the trench upper side wall portions with a thickness of about 150 nM. Note that these thick isolating layers 340 and 360 effectively correspond to the recessed oxide isolating layer 100 in FIG. 1, yet the thick isolating layers 340 and 360 represent an isolation structure formed within the trench.

Figure 3F:
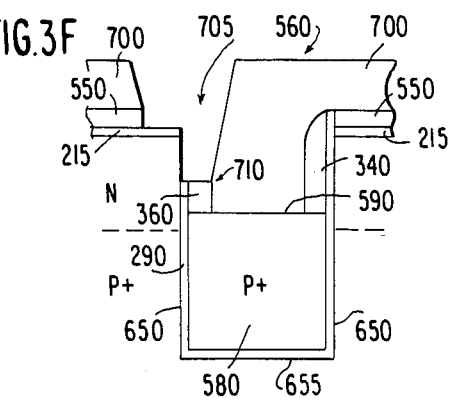
Figure 3G:
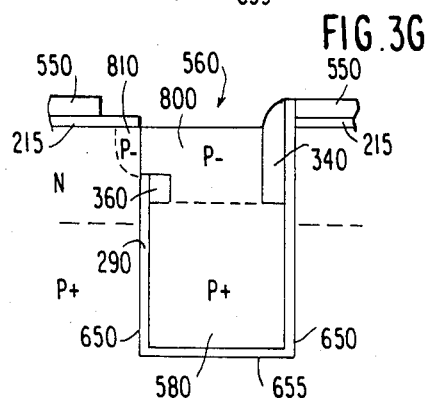

After the thick isolating layers 340 and 360 are formed as shown in FIG. 3E, a layer of photoresist 700 is formed along the top of the semiconductor substrate 210, including the trench 560. The resist 700 is exposed and developed to expose a portion of the thick isolating layer 360 and the thin insulating layer 290. As shown in FIG. 3F, the exposed oxide layers are then removed. This removal can be conducted via known semiconductor methods, for example, reactive ion etching (RIE) in a gas. After the portion of the thick isolating layer 360 and the thin insulating layer 290 has been removed, the resist 700 is then removed. The step shown in FIG. 3D is used to define a "buried contact" that couples the source diffusion region 270 to the polysilicon inside the trench. As shown in the aforementioned U.S. patent application, Ser. No. 626,512, this mask step could be eliminated by providing a separate conductor layer on top of the substrate to form a "bridge contact" that couples the source diffusion to the poly-filled trench. In the present invention, both the "buried contact" and the "bridge contact" are contemplated. The depicted buried contact embodiment is preferred. After the resist 700 has been removed, the upper portion of the trench 560 is refilled with a polysilicon refill 800. This is shown in FIG. 3G.

Figure 3H:
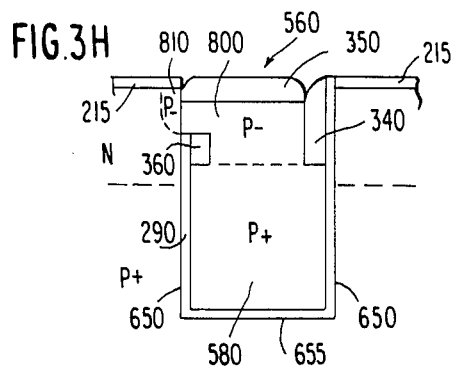

Once the upper portion of the trench 560 has been refilled and the masking oxide layer 550 has been removed, the top surface of the polysilicon refill 800 is removed (or planarized) to a level slightly below the level which coincides with the top level of the silicon substrate 210. See FIG. 3H. Once the polysilicon refill 800 has been slightly removed, and a thick isolating layer 350 is formed along the top of the trench 560. In a preferred embodiment, the thick isolating layer 350 is formed to a thickness of approximately 150 nM. If the "bridge contact" embodiment is used, the conductive material would be deposited and patterned to form the bridge contact, and isolation layer 350 would be deposited on top of the bridge contact. The top surface of the thick isolation layer 350 can then be planarized to coincide with the top surface of the semiconductor substrate 210. Thus, there is formed a trench capacitor cell 280 having an isolating structure 340, 350 and 360 within its trench.

The formation of the transistor shown in FIG. 2 is not herein described, its formation being well known in the art. It should be noted that during the anneal cycle that drives in the P+ dopants to define the drain diffusion, dopant ions will diffuse from the refill polysilicon 800 into the adjacent substrate portion to define the source diffusion 270. The "buried contact" is now defined by the portions of source diffusion 270 and polysilicon refill 800 that are in contact with one another.

Figure 4A:
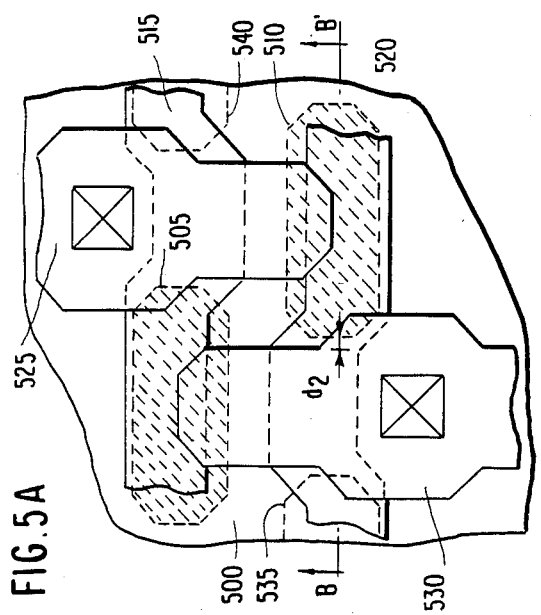
FIG. 4A is a magnified top plan view of a portion of a semiconductor substrate showing an example of the size of semiconductor substrate area devoted to a memory cell capacitor, when the prior art recessed oxide isolation approach as used to construct a dynamic memory array.

As an illustration of the increased capacitor cell size and the more efficient use of semiconductor substrate area, two additional figures are shown. FIG. 4A shows a magnified top plan view of a portion of a dynamic memory array constructed on a semiconductor substrate 400 using the prior art Recessed Oxide isolation approach. In looking downward toward the top surface of the semiconductor substrate 400, there is shown the outline of the side walls of two memory cell capacitors indicated by the dashed lines 405 and 410. Shown running from left to right are wordlines 415 and 420. It should be noted that the wordlines are formed of a polysilicon material that defines the gate electrode 60 of the device shown in FIG. 1. The wordlines 415 and 420 are separated from the top surface of the semiconductor substrate by an oxide layer. Next, shown running from top to bottom are bitlines 425 and 430. These bitlines are normally of a metal material, and are separated from the wordlines and semiconductor substrate by another oxide layer. The wordline 415 and the bitline 425 are associated with the memory cell capacitor 410, while the wordline 420 and bitline 430 are associated with the memory cell capacitor 405. Thus, adjacent memory cells are coupled in a staggered relationship with respect to both the wordlines and the bitlines. The operation of the wordlines and bitlines are not of importance with a description of the present invention, so their operation will not be described. However, the bitline and wordline illustrations are of importance in noting the device spacings which are required when the prior art Recessed Oxide approach is used as shown in FIG. 4A. In particular, with the Recessed Oxide approach, there is a minimum distance $d_1$ which must be maintained between the memory cell capacitor 410 and the gate electrode of the adjacent memory cell as defined by wordline 420. This minimum distance must be maintained to avoid electrical interferences (i.e., due to leakage from the channel region of the adjacent memory cell), there is parasitic device formation between the trench capacitor and the active semiconductor region abutting the trench capacitor. These minimum distance requirement leads to much wasted semiconductor substrate area as can be seen in the top plan view of FIG. 4A.

Figure 5A:
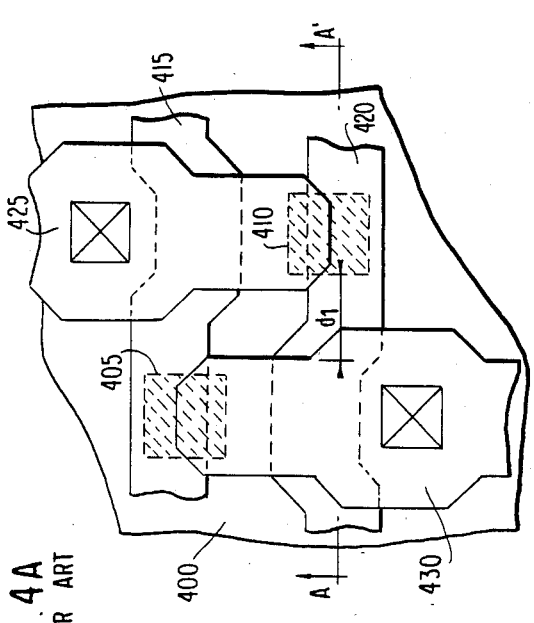
FIG. 5A is a magnified top plan view of a preferred array layout embodiment of the present invention.

The present invention realizes great improvement in the increased efficient usage of semiconductor substrate area. In FIG. 5A, there is shown a magnified top plan view of a portion of a dynamic memory array constructed on a semiconductor substrate 500 using the trench isolation approach of the present invention. In a layout manner similar to that shown and described for FIG. 4A, there is shown memory cell capacitors 505 and 510, wordlines 515 and 520, and bitlines 525 and 530. In FIG. 5A, wordline 515 and bitline 525 are associated with the memory cell capacitor 510, while wordline 520 and bitline 630 are associated with memory cell capacitor 505. Again, the memory cells are connected in a staggered relationship with respect to both the wordlines and the bitlines. In FIG. 5A, the memory cell capacitors 505 and 510 have been constructed using the trench isolation approach of the present invention. Several advantages are realized as can be easily seen in the top plan view of FIG. 5A. First, the memory cell capacitor size is shown to have been increased by a factor of approximately 3 in the lateral (i.e., left-to-right) direction. The capacitor has assumed an elongated, rectangular shape as opposed to the square shape in the prior art as shown in FIG. 4A. As the size of the memory cell capacitor has been increased, so has its charge storage capacity. This is due to the elimination of a ROX region in this direction, as described below.

Next, as can be seen in FIG. 5A, the minimum distance $d_2$ required between the memory cell capacitor 510 and the gate electrode of the adjacent memory cell as defined by wordline 520 is effectively equal to zero. That is, since the isolation is self-aligned with respect to the inside edges of the capacitor, the capacitor can now abut the channel (i.e., active semiconductor) region of the adjacent device without leakage (i.e., parasitic device formation) concerns. In fact, the memory cell capacitor 510 and adjacent memory cells gate electrode are able to be slightly overlapped. Thus, it can be seen that the trench isolation approach of the present invention results in a more efficient use of the semiconductor surface area.

Figure 4B:
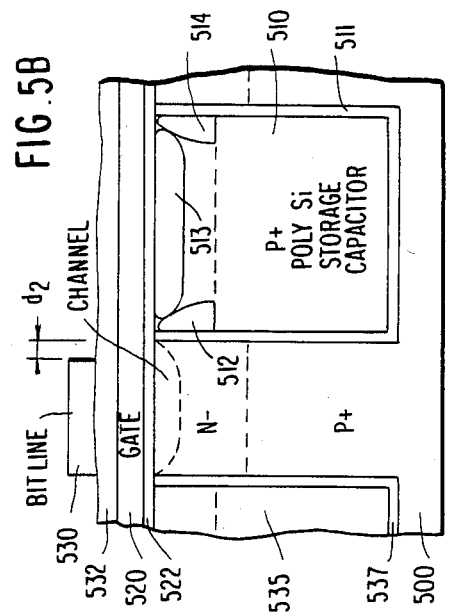
FIG. 4B is a cross-sectional view taken along lines A—A' of FIG. 4A.
Figure 5B:
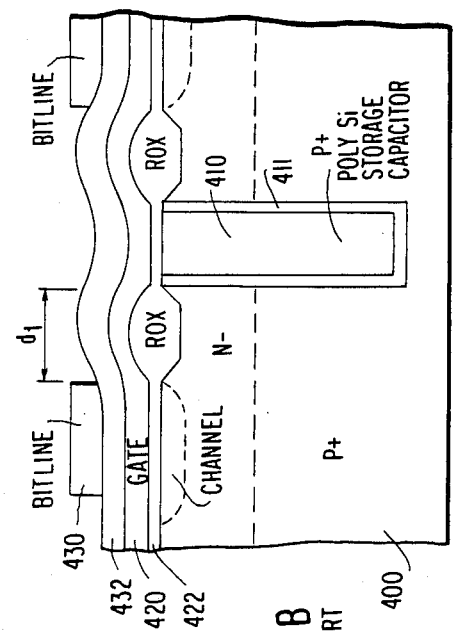
FIG. 5B is a cross-sectional view taken along lines B—B' of FIG. 5A.

The advantages of the present invention are most clearly shown by a comparison of FIG. 4B and Figure 5B. FIG. 4B is a cross-sectional view taken along lines A—A' in FIG. 4A. The space d1 in FIG. 4A is shown as a ROX region in FIG. 4B that separates the channel region of the gate electrode from the capacitor 410. FIG. 5B is a cross-sectional view taken along lines B—B' in FIG. 5A. Note that there is no ROX region corresponding to the ROX region in FIG. 4B such that the capacitor 510 abuts the channel region beneath the gate electrode of the transistor of the adjacent memory cell. Also, because there is no ROX reion to consume chip area, the capacitor 510 is much wider (i.e. longer in the left-to-right dimension) than is capacitor 410 as shown in FIG. 4B. In practice, in the array shown in FIG. 5A, both of the short sides of the rectangular-shaped capacitor 410 will abut the channel regions of adjacent memory cell transistors. Furthermore, note from FIG. 5A that the buried contact between the poly filled trench and the source diffusion of the associated FET (i.e. the portion of the trench side walls in which the side wall defined isolation layers are partially removed) is located at approximately the midpoint of the long side of the trench, far removed from the channel regions of the adjacent transistors.

As a result of the hereinbefore mentioned embodiments of the present invention, a semiconductor trench capacitor cell is furnished having its isolation structure formed within and self-aligned to the trench side walls. With the isolation structure formed within the trench, capacitor cell size can be increased, thus facilitating the construction of memory arrays which can be more density packed.

Figure 6:
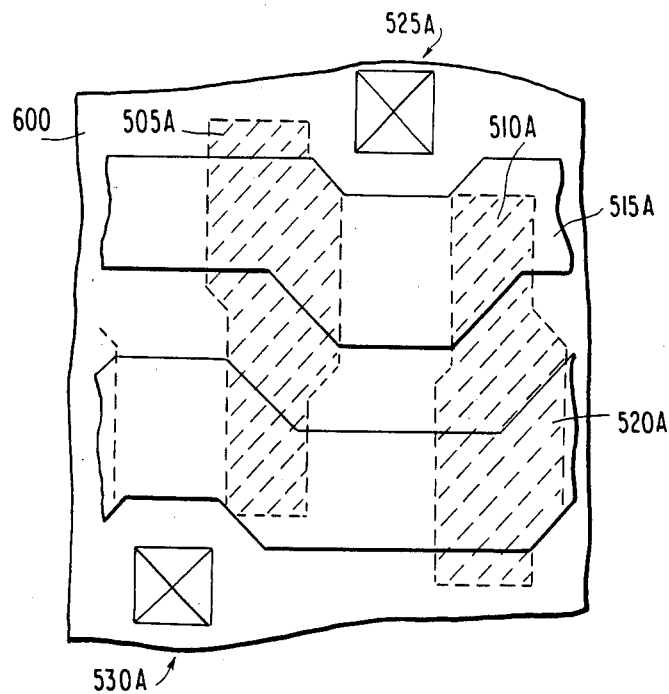
FIG. 6 is a top plan view of a portion of a semiconductor substrate showing an alternate array layout embodiment of the present invention.
Figure 7:
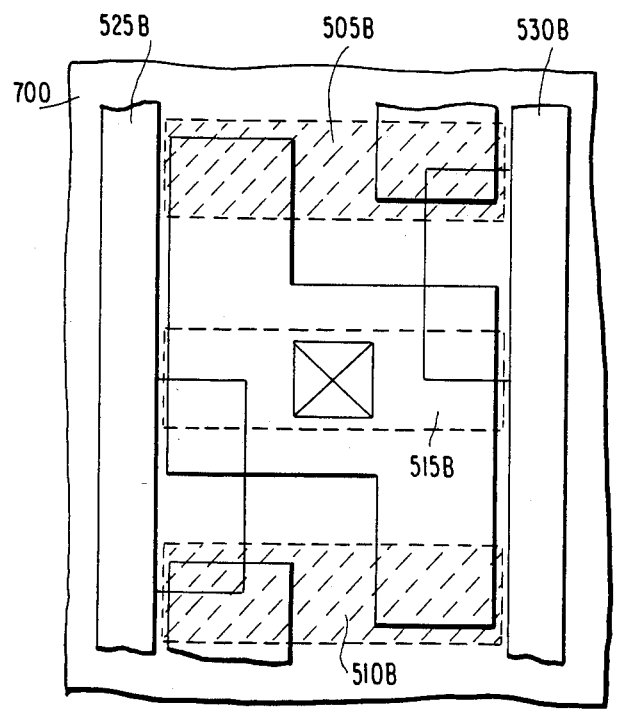
FIG. 7 is a top plan view of a portion of a semiconductor substrate showing another alternate array layout embodiment of the present invention.

Utilizing the trench capacitor structure of the present invention, other array layout embodiments can be constructed that maximize cell area while minimizing chip space. In the layout embodiment of the invention as shown in FIG. 5A, ROX regions are still formed between adjacent trench capacitors. In the layouts shown in FIGS. 6 and 7, these ROX regions are eliminated. In FIG. 6, the capacitors 505, 510 are reconfigured so that they are perpendicular to the wordlines 515, 520. That is, the trench-to-trench spacing is now a function of defining a space for the source diffusion, rather than defining a ROX region as in FIG. 5A. In another layout embodiment of the present invention as shown in FIG. 7, the metal bitlines 525, 530 of FIG. 5A are replaced by diffused bitlines and a metal wordline 515 runs through the central portion of the layout. Again, there is no ROX region between adjacent capacitors.

It is thought that the present invention and many of its intended advantages will be understood from the foregoing description, and it will be apparent that various changes may be made in the form, construction and arrangement of the parts thereof, without departing from the spirit and scope of the invention and sacrificing all of its material advantages, the form hereinbefore described being merely a preferred or exemplary embodiment thereof.

I claim:

1. A semiconductor trench capacitor structure, comprising:
   a semiconductor substrate;
   a trench formed in said semiconductor substrate, said trench having a bottom wall, a side wall having an upper side wall portion and a lower side wall portion;
   an insulating layer formed on said bottom wall and said lower side wall portion;
   a side wall-defined isolating layer formed within an upper portion of said trench and extending from at least some of said upper side wall portion toward a center of said trench to provide isolation so as to prevent parasitic device formation with an active semiconductor region abutting said trench, said isolating layer being formed of an electrical insulation material and being substantially thicker than said insulating layer and thinner than one-half of a width of said trench; and
   a conductive electrode formed of a conductive material deposited within a remainder of said trench.

2. A semiconductor trench capacitor structure as claimed in claim 1, further comprising:
   an isolating cap layer formed on the top of said conductive electrode.

3. A semiconductive trench capacitor structure as claimed in claim 1, further comprising:
   a buried contact for coupling said conductive electrode to a diffusion region formed in said semiconductor substrate, said buried contact being formed by a remaining upper side wall portion of said trench side wall that does not have said isolating layer extending therefrom.

4. A semiconductor trench capacitor structure as claimed in claim 1, wherein said isolating layer is at least 75 nano-meters in thickness.

5. A dynamic memory cell, comprising a transistor having source, gate and drain electrodes and an associated trench capacitor formed in a semiconductor substrate, said capacitor comprising:
   a trench formed in the substrate, said trench having a bottom wall and a side wall;
   a dielectric layer formed on said bottom wall and on lower portions of said side wall;
   a side wall-defined isolation layer formed within said trench and extending from at least some of an upper portion of said side wall toward a center of said trench so as to prevent parasitic device formation with an active semiconductor region abutting said trench, said isolation layer being formed of an electrical insulation material and being substantially thicker than said dielectric layer and thinner than one-half of a width of said trench;
   at least one layer of doped polysilicon filling a remainder of said trench; and
   a buried contact for coupling a portion of said doped polysilicon layer abutting remaining ones of said upper portions of said side wall to an adjacent one of the source and drain electrode of said transistor.

6. An array of dynamic memory cells, each of said cells comprising a transistor disposed in a first direction and having source, gate, drain electrodes, and a channel region below the gate, and a storage capacitor occupying a trench having a bottom and side wall, the capacitor being coupled to one of the source and drain electrodes of the transistor, said array comprising:
   a plurality of wordlines disposed in a second direction orthogonal to said first direction, each respective wordline interconnecting the gate electrodes of alternate transistors disposed along the path of said respective wordline; and
   a plurality of bitlines disposed in said first direction, each respective bitline interconnecting one of the source and drain electrodes of the alternate transistors disposed along the path of said respective bitline;
   each of the storage capacitors having an insulating layer disposed on said bottom wall and lower portions of said side wall, and having a side wall defined isolation layer disposed within said trench extending from at least some of an upper portion of said side wall toward a center of said trench so as to prevent parasitic device formation with an active semiconductor region of a different dynamic memory cell abutting said trench, said isolation layer being formed of an electrical insulation material and being substantially thicker than said insulating layer and thinner than one-half of a width of said trench, the storage capacitors being disposed in said second direction, each of the storage capacitors abutting the channel region of the transistor of an adjacent one of the memory cells.

7. An array of dynamic memory cells as claimed in claim 6, wherein each of the storage capacitors has an elongated rectangular shape.

8. An array of dynamic memory cells as claimed in claim 7, wherein said elongated rectangular shape results in each of said storage capacitors having two long sides and two short sides, each of said short sides of said storage capacitors abutting a channel region of a transistor of an adjacent memory cell.

9. An array of dynamic memory cells as claimed in claim 8, wherein each of the storage capacitors is coupled to one of the source and drain electrodes through a selected portion of its side wall that does not have said side wall defined isolation layer extending therefrom, said selected portion being located at approximately a midpoint of one of said long sides of said storage capacitor walls, each of said side walls having an upper side wall portion and a lower side wall portion.

* * * * *